(12) United States Patent
Sheu

(10) Patent No.: US 8,097,900 B2
(45) Date of Patent: Jan. 17, 2012

(54) MONOLITHICALLY INTEGRATED LIGHT-ACTIVED THYRISTOR AND METHOD

(75) Inventor: Yeuan-Ming Sheu, Berwyn Heights, MD (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 0 days.

(21) Appl. No.: 13/112,201

(22) Filed: May 20, 2011

(65) Prior Publication Data

US 2011/0233380 A1 Sep. 29, 2011

Related U.S. Application Data

(62) Division of application No. 11/371,940, filed on Mar. 10, 2006, now Pat. No. 7,582,917, which is a division of application No. 12/507,100, filed on Jul. 22, 2009, now Pat. No. 7,824,967, which is a division of application No. 12/889,580, filed on Sep. 24, 2010, now Pat. No. 7,972,908.

(51) Int. Cl.
*H01L 29/74* (2006.01)

(52) U.S. Cl. ............................. 257/113; 438/7

(58) Field of Classification Search .................. 257/113, 257/115, 116, 117, 118, E27.079, E29.036; 438/7, 16, 27

See application file for complete search history.

(56) References Cited

U.S. PATENT DOCUMENTS

| | | | |
|---|---|---|---|
| 4,186,409 A | 1/1980 | McMullin | |
| 4,343,014 A | 8/1982 | Jaecklin | |
| 4,497,109 A | 2/1985 | Huber et al. | |
| 4,737,834 A | 4/1988 | Spenke et al. | |
| 4,866,500 A | 9/1989 | Nishizawa et al. | |
| 4,888,627 A | 12/1989 | Pattanayak et al. | |
| 4,908,687 A | 3/1990 | Temple | |
| 5,017,991 A | 5/1991 | Nishizawa et al. | |
| 5,428,228 A | 6/1995 | Ogura et al. | |
| 5,663,580 A | 9/1997 | Harris et al. | |
| 5,780,877 A | 7/1998 | Bireckoven et al. | |
| 5,793,063 A | 8/1998 | Whitney | |
| 6,034,381 A | 3/2000 | Pezzani | |
| 6,218,682 B1 * | 4/2001 | Zucker et al. | 257/113 |
| 6,392,615 B1 * | 5/2002 | Shiraishi et al. | 345/60 |
| 6,724,043 B1 | 4/2004 | Ekkanath Madathil | |

(Continued)

*Primary Examiner* — Thao P. Le
(74) *Attorney, Agent, or Firm* — Daniel J. Long; Bingham McCutchen LLP; Robert C. Bertin

(57) ABSTRACT

A monolithically integrated light-activated thyristor in an n-p-n-p-n-p sequence consists of a four-layered thyristor structure and an embedded back-biased PN junction structure as a turn-off switching diode. The turn-off switching diode is formed through structured doping processes and/or depositions on a single semiconductor wafer so that it is integrated monolithically without any external device or semiconductor materials. The thyristor can be switching on and off optically by two discrete light beams illuminated on separated openings of electrodes on the top surface of a semiconductor body. The carrier injection of the turning on process is achieved by illuminating the bulk of the thyristor with a high level light through the first aperture over the cathode to create high density charge carriers serving as the gate current injection and to electrically short the emitter and drift layer. The switching off of the thyristor is achieved by shorting the base layer and the cathode layer by illuminating the embedded back-biased PN junction of the TURN-OFF switching diode. The patterned doping profile and the interconnect between the emitter and the base region of the light activated thyristor makes possible a monolithic and/or plantar integrated fabrication of the semiconductor switching device on a single semiconductor wafer via the standard semiconductor fabrication process.

1 Claim, 18 Drawing Sheets

U.S. PATENT DOCUMENTS

| | | | |
|---|---|---|---|
| 6,770,911 B2 * | 8/2004 | Agarwal et al. | 257/77 |
| 7,057,214 B2 * | 6/2006 | Giorgi et al. | 257/118 |
| 7,972,908 B2 * | 7/2011 | Sheu | 438/133 |
| 2001/0020705 A1 | 9/2001 | Miyata | |
| 2005/0045908 A1 | 3/2005 | Nakajima et al. | |
| 2008/0191238 A1 * | 8/2008 | Madathil et al. | 257/133 |

* cited by examiner

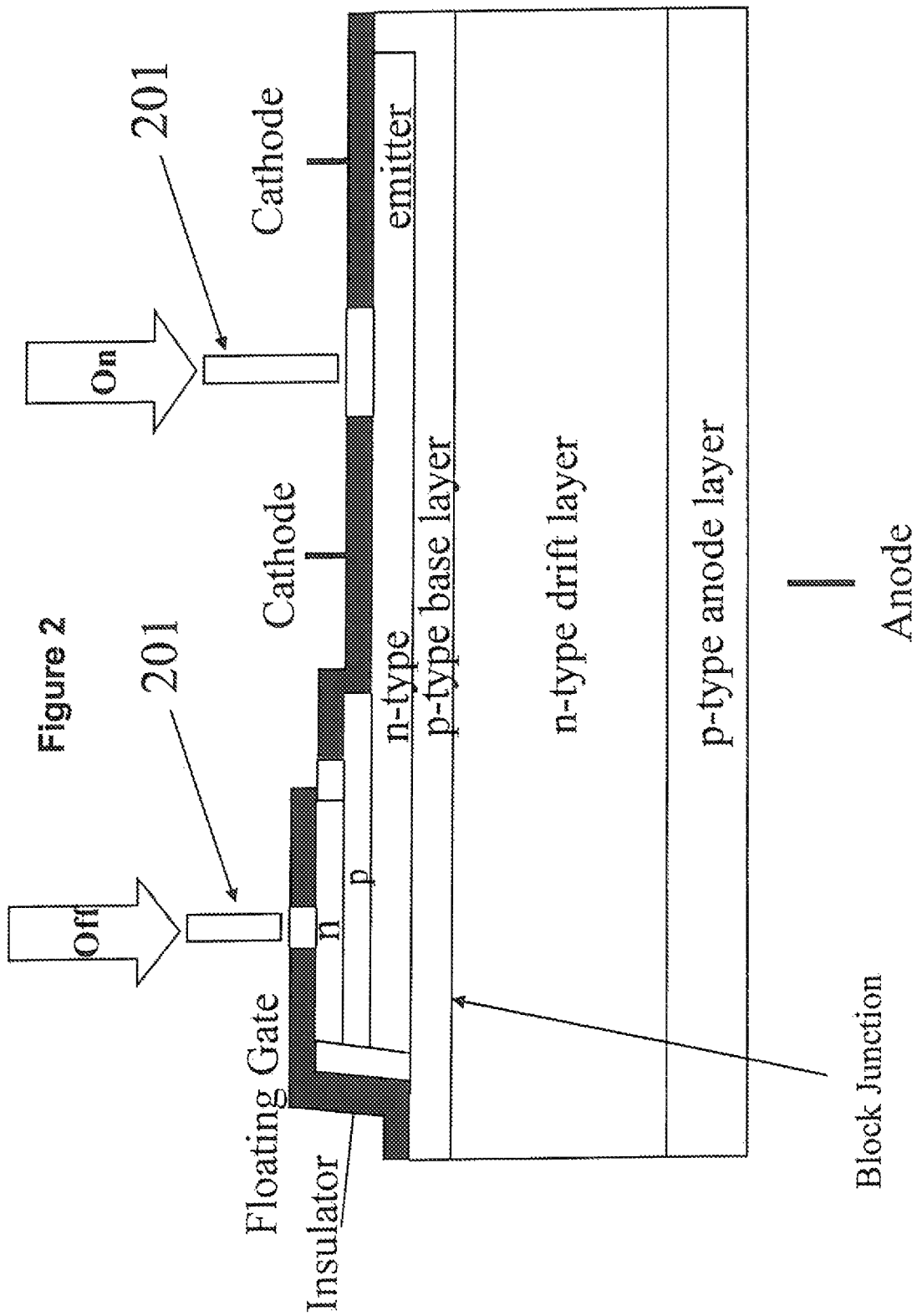

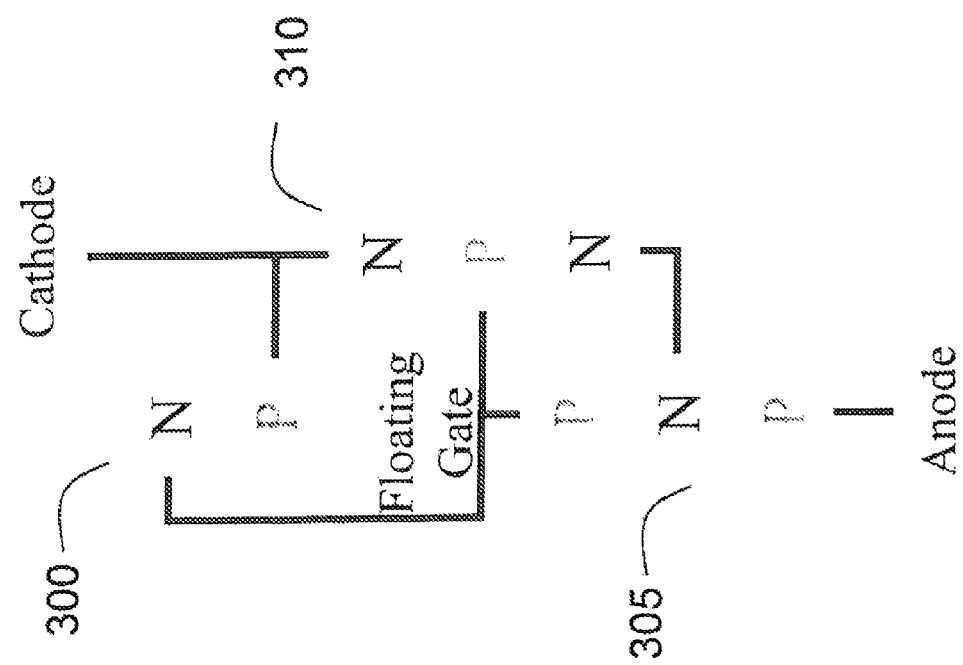

MONOLITHICALLY INTEGRATED LIGHT-ACTIVED THYRISTOR AND METHOD

CROSS REFERENCE TO RELATED APPLICATIONS

This application claims priority to and is a divisional of U.S. application Ser. No. 12/889,580 filed Sep. 24, 2010 which is a divisional of U.S. application Ser. No. 12/507,100 filed Jul. 22, 2009 which is a divisional of Ser. No. 11/371,940 filed on Mar. 10, 2006.

FIELD OF INVENTION

The present invention relates generally to the field of power electronics and, more particularly, to an optically turn-on and turn-off power thyristor.

BACKGROUND OF THE INVENTION

Compared to other semiconductor power switching devices like MOSFETs and IGBTs, the thyristor is generally known for its ability to sustain large current and its ability to be switched at high voltage. With a low on-state voltage drop for a given current density, a thyristor provides one of the lowest power dissipations among power semiconductor devices. A thyristor typically has four basic semiconductor layers, the emitter, base, drift and anode layers, respectively, with an alternative doping profile to form three junctions. Adjacent layers are oppositely doped with high doping on two outer layers and light doping on inner layers. When a voltage is applied between the anode electrode and cathode electrode, at least one junction is reverse biased to sustain a majority of the applied voltage, and the voltage is held mainly across the lightly doped drift layer until its breakdown.

A thyristor can be viewed as a pair of back-to-back coupled bipolar junction transistors. The lightly doped inner regions act as the base of two transistors. When a thyristor is under high voltage without protection, the leakage current across the lightly doped regions serves as the base current of the transistors and is amplified. When there are enough earners inside the inner layers, the device is turned on. The first method of turning on a thyristor is, in fact, to apply a voltage higher than its blocking value. When the applied voltage is high enough, the thyristor is turned on through the current gain of the leakage current. However, the turn-on voltage is not precisely controllable and high voltages sometimes induce damage inside the device through breakdowns. In practice, the leakage current diverting structures like the cathode short and the anode short are added in the design to enhance the voltage holding capability.

For more controllable turn-on switching, the carriers are injected from a gate electrode on one of the inner layers. Usually, the gate current is only injected over a portion of the base layer, so the conducting current of a thyristor is not fully spread over the whole layer initially. The thyristor will not be fully turned on until carriers spread across the layer by lateral diffusion. The time of carrier spreading depends on the lateral diffusion velocity, which limits the turn-on time. One way to circumvent the slow turn-on time is to inject the gate current over a large area. This may, in practice be implemented with inter-digitization of the gate electrodes and reduces the active cathode area for supporting high current.

An alternative approach for turning on a thyristor is to generate carriers locally inside the inner junctions through absorption of light. There have been several attempts in the prior art to use a photonic gate over the cathode area which permits light to pass through. Photo-generated carriers acting as the gate current injection in the base region start the turn-on process. With appropriate selection of the light wavelength, the depth of the light absorption across the device can be varied to fit different junction depths. Furthermore, a high level of illumination across the whole thyristor structure can instantaneously generate a high density of carriers across the whole device. The high density of carriers collapses the junction voltage and generates the current flow instantly without much delay from carriers being transported through the thyristor drift layer and the lateral diffusion from the gate electrode area to the main cathode area. Therefore, a light controlled thyristor has the advantages of shorter turn-on delay time and shorter turn-on time.

In practice, thyristors are employed in power circuits with high voltages and large currents. The trigger circuit to switch a thyristor through the gate electrode is difficult to isolate from high voltages. Instead of triggering through an electrical gate current, a high degree of electrical isolation between the power and trigger circuit may be achieved by switching with light through optical wave guide-like fibers.

Power MOSFETs and IGBTs will be switched off if the gates are turned off. Due to the self-sustaining effect of a thyristor, the current conduction of a thyristor will continue even after the gate is turned off. A thyristor does not need to maintain the gate injection like other power semiconductor devices. However, the gate of a thyristor loses control after the thyristor is switched on. To actively switch a thyristor from its on-state to the forward-blocking state can only be accomplished by reducing its current below a threshold or by reversal of the anode voltage. In an AC circuit, a thyristor is switched on and off in a cycle while the polarity of the voltage is alternative across the anode and cathode electrodes. However, it is not practical to switch polarity to reverse the anode voltage of a power device in many applications. Typically, the thyristor current is drained through a reverse gate current during turn-off.

In early attempts, the Gate Turn-Off thyristor (GTO) utilized an external control circuit to reverse the gate current and the MOS Controlled Thyristor (MCT) incorporates parallel MOSFETs to create emitter shorts. The external control circuit of a GTO diverts the current through the gate electrode and needs to carry a similar amount of current as a thyristor in order to switch off the thyristor. The diverted current is much larger than the turn-on gate current and this increases the difficulty of the control circuit design. Typically, the external current-diverting circuit of a GTO is much bigger in order to accommodate large thyristor current and there is basically no electrical isolation between the power and trigger circuits. On the other hand, a MCT uses MOSFETs to short the emitter and the base of a thyristor. Like the case of the external turn-off circuit of a GTO, MOSFETs in a MCT also need to take on the majority of the thyristor current. However, the current carrying capability of a MOSFET is limited by its surface channel and is much smaller than the bulk of a thyristor. Therefore, massively parallel MOSFET unit cells are integrated in order to carry large current. The MOSFETs occupy large real estates and limit the main conduction area of a MCT. Hence, MCTs have not been widely used for practical applications.

The limitation of the electronic switching-off of a thyristor is either due to the current carrying capability of MOSFETs to create emitter shorts or the limited current and speed of external current-diverting circuits. In addition, the electronic on-activation of a thyristor suffers slow turn-on and long delay due to the limited speed of carrier transport. A new control technique is needed to improve these short falls.

In earlier attempts, a photonic gate was employed in the light controlled thyristor to permit light. The illumination of light through the photonic gate generates carriers in the base region as the gate current injection to turn on the device. However, an external circuit is still employed for turning off a light controlled thyristor to divert the conducting current as a GTO. Various attempts with alternative electronic switching-off schemes also suffer similar shortfalls. Hence, the light controlled thyristor did not solve the whole problem that limits thyristors in many applications.

To improve the turn-off limitation of the light controlled thyristor, a photonic controllable switching structure was introduced on a thyristor. In O. S. F. Zucker et. al. (U.S. Pat. No. 6,218,682 B1, Apr. 17, 2001), the optically-activated thyristor adds an external shorting structure on top of a light activated thyristor. The shorting structure is electrically and mechanically bonded across the emitter and base region of a thyristor. The added shorting structure comprises a PN junction and has an optical aperture for introducing light. Furthermore, an aperture over the emitter region for permitting light is introduced to better utilize the wafer surface area for current conduction instead of separated photonic gates. Therefore, a high level of light illumination may be introduced through the aperture to generate high density carriers in the bulk of the thyristor to direct short the whole device for fast switching on. During the conducting state of the thyristor, the shorting PN junction is open and under the back bias. When light is introduced onto the shorting structure, the photo-generated carriers collapse the voltage and electrically short the cathode and the base of the thyristor to create emitter shorts. The illuminated shorting structure diverts the conducting current to bypass the emitter and then turns off the thyristor. However, the main thyristor structure and the shorting structure are fabricated separately on different semiconductor wafers. The wafer with the shorting structure is then diced and externally bonded on the main thyristor structure. In addition to the alignment of the optical fibers to apertures, additional alignment and bonding of the shorting structure to the main thyristor structure in the back end processing increase the complexity and cost of the fabrication.

Accordingly, there remains a need for an improved light activated thyristor. There remains a further need for a thyristor that is compact and monolithically integrated, so that the complexity and cost of fabrication may be greatly reduced to fit practical applications.

SUMMARY OF THE INVENTION

According to the present invention, a monolithic, high power thyristor on a semiconductor wafer is provided. The thyristor may incorporate photonic switching control. The monolithically integrated light activated thyristor comprises four alternatively doped layers of a basic thyristor structure, an emitter, a base, a drift and an anode layer, respectively, and additional two oppositely doped zones monolithically integrated on top of the emitter layer. The added two oppositely doped zones may be formed of the same or different semiconductor materials. According to one embodiment, the adjacent layers and zones of the monolithically integrated light activated thyristor are of the opposite doping and form an n-p-n-p-n-p structure.

During the on-state of the thyristor, the two oppositely doped zones on the top form a back-biased PN junction acting as a switching diode. The zone adjacent to the emitter layer with the opposite doping is electrically shorted with the emitter layer on the top surface to the cathode and the other is electrically connected to the base layer through interconnect over an insulating layer. Two apertures for permitting light control are formed by openings of the cathode electrode over the emitter region and of the floating gate over the junction of the switching diode. The construction of the monolithically integrated light activated thyristor is achieved through the processes of spatially doping and/or depositions on a single semiconductor wafer, without any external attachment of addition semiconductor devices.

The overall device consists of multiple cells of functionally identical units. In each unit device, there are two sets of optical apertures on the top surface: one is on the cathode acting as a gate for the turn-on process; the other is over the back-biased junction of the embedded switching diode acting as a switch to turn off the thyristor.

According to one embodiment, a method of activating the thyristor incorporates applying a voltage across the top emitter layer and the bottom anode layer of the semiconductor device. The turn-on process is achieved by illuminating light through the cathode aperture and photo-generating carriers on the base layer and the drift layer acting as the gate current injection. Furthermore, a high level illumination generates a high density of charged carriers to collapse the voltage across the blocking junction and turns on the whole device through direct current flow and/or lateral carrier diffusion. The device is kept on through the thyristor regenerative action even when the illumination is stopped.

According to another embodiments, an embedded back-biased switching diode structure incorporated on top of the emitter layer seizing as a turn-off switch between the cathode electrode and the base layer. When illuminating the aperture over the junction of the embedded switching diode, the photo-generated carriers collapse the back-biased junction and electrically short the base layer and the cathode. The current then bypasses the emitter layer to stop the injection through the emitter-base junction. Hence, the current diversion stops the thyristor regeneration effect and turns off the thyristor when the current is reduced below the holding level.

The light controlled turn-on and turn-off processes allow the electrical isolation of the trigger circuit from high voltages and have a capability of remote control through a light guiding scheme such as the utilization of optical fiber. Moreover, the present invention allows the turn-off switch diode structure to be monolithically integrated into the same semiconductor wafer during fabrication. The embedded switching diode can be incorporated in the fabrication process, without any bonding or integration of the external switching device in the back-end process. The present invention accordingly provides a better integration of power semiconductor devices in many circuits and reduces the complexity and cost of fabrication.

The above described features and advantages of the present invention will be more fully understood with reference to the detailed description, drawings and appended claims.

BRIEF DESCRIPTION OF THE DRAWINGS

FIG. 2 shows, in cross section, a unit cell of the embodiment in a non-planar construction. The layer structure is formed through multiple steps of spatial doping processes and/or depositions and etching, according to an embodiment of the present invention.

FIGS. 3A and 3B show circuit representations according to an embodiment of the present invention.

DETAILED DESCRIPTION OF THE PREFERRED EMBODIMENTS

The present invention relates to a high power, monolithically integrated thyristor-based device with a switching diode structure that incorporates optical on and off control.

The semiconductor devices described herein are based on the use of light to actively switch on and/or off, and are referred to by the generic name "light controlled thyristors" (LCTs) or "optically controlled thyristors" (OCTs). Optical activations involve illuminating a semiconductor device with light to create electron-hole pairs at the site of absorption and do not require the injection of carriers through carrier transport. Hence, the optical activation of the device may be faster than the injection, which is limited by drift velocity and lateral diffusion of carriers.

In addition to switching on, the present invention provides the ability to actively switch off a power semiconductor device with light. The underlying principle for switching off a thyristor is to create an electrical short across the emitter-base injection junction. The emitter short is accomplished by using light to illuminate the back-biased junction of the embedded-switching diode structure connecting the base layer and the cathode electrode. The selection of the optical wavelength of the activating light results in an ability to control the absorption length, and hence the volume and depth of the semiconductor material activated by the light. In addition, the carrier concentration in the switching junction may also be controlled by the amount of light.

The illuminating light may be generated by a separate circuit far from the power circuit. Light may be introduced into the device through an optical wave-guide, such as an optical fiber. The electrical isolation of the trigger circuit from the main power circuit may be realized by photonic switching on and off. Furthermore, the monolithic integration of switching-off diodes, according to an embodiment of the present invention, allows an optically controlled thyristor to be fabricated on a single semiconductor wafer and reduces the complexity and cost of fabrication.

According to an embodiment, an array of functionally identical unit cells is introduced onto a semiconductor wafer. The total number of unit cells may be varied to fit the requirement of applications with different layouts. An example of fabrication steps of a unit cell of the preferred embodiment is illustrated in FIGS. 4-17.

Figure 4:
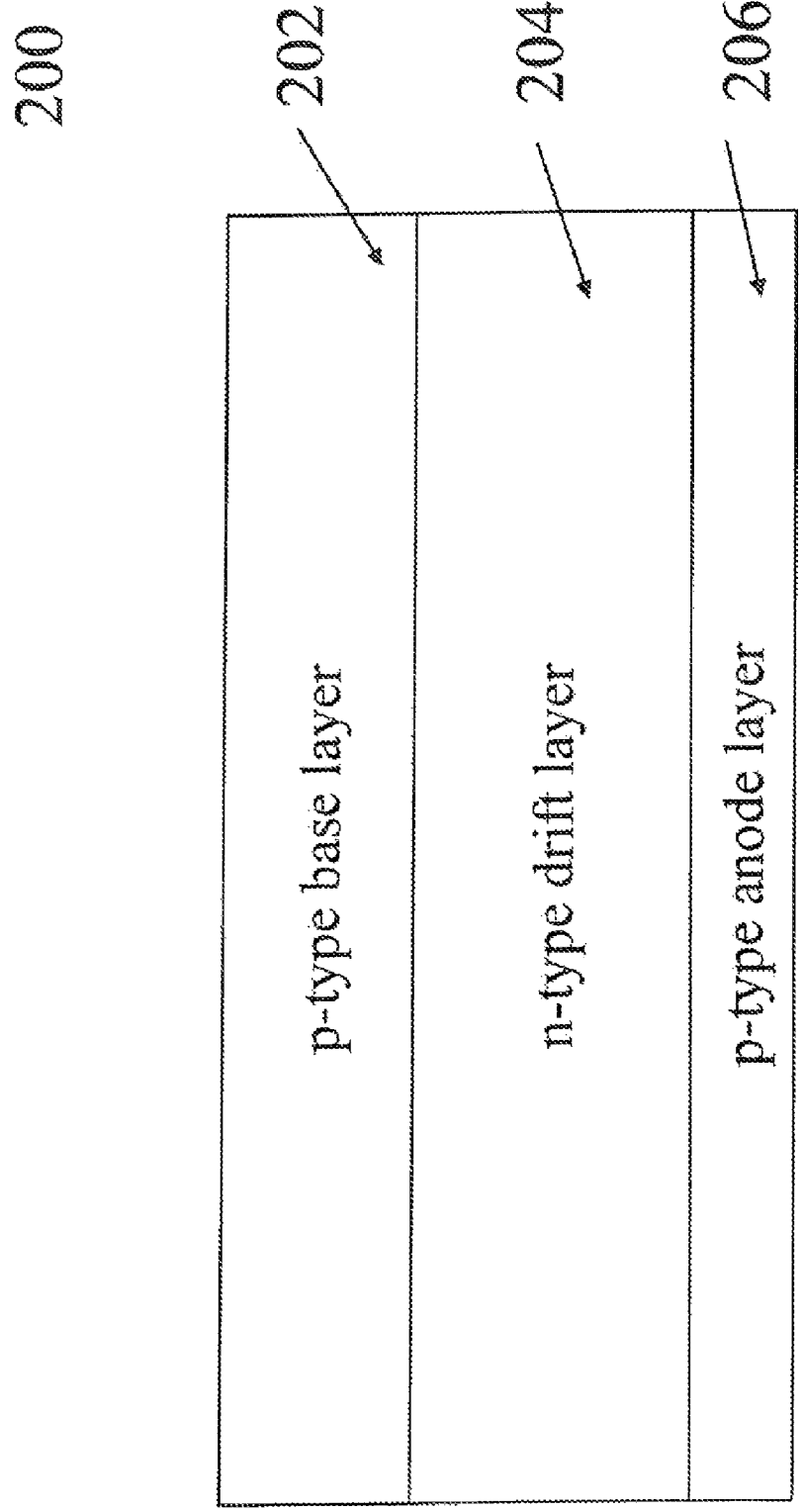
FIGS. 4-17 show the various steps of a fabrication process, according to one example of an embodiment of the present invention.

Referring to FIG. 4, beginning with a portion of a lightly doped n-type semiconductor wafer 200, a n-type drift layer 204 is sandwiched by two p-type layers (the base layer 204 on the top and an anode layer 206 on the bottom). The two p-type layers and subsequent layers may be formed by diffusion, ion implantation, epitaxial growth, or any other appropriate technique. The p-type anode layer may be heavily doped and the p-type base layer may be lightly doped.

Figure 5:
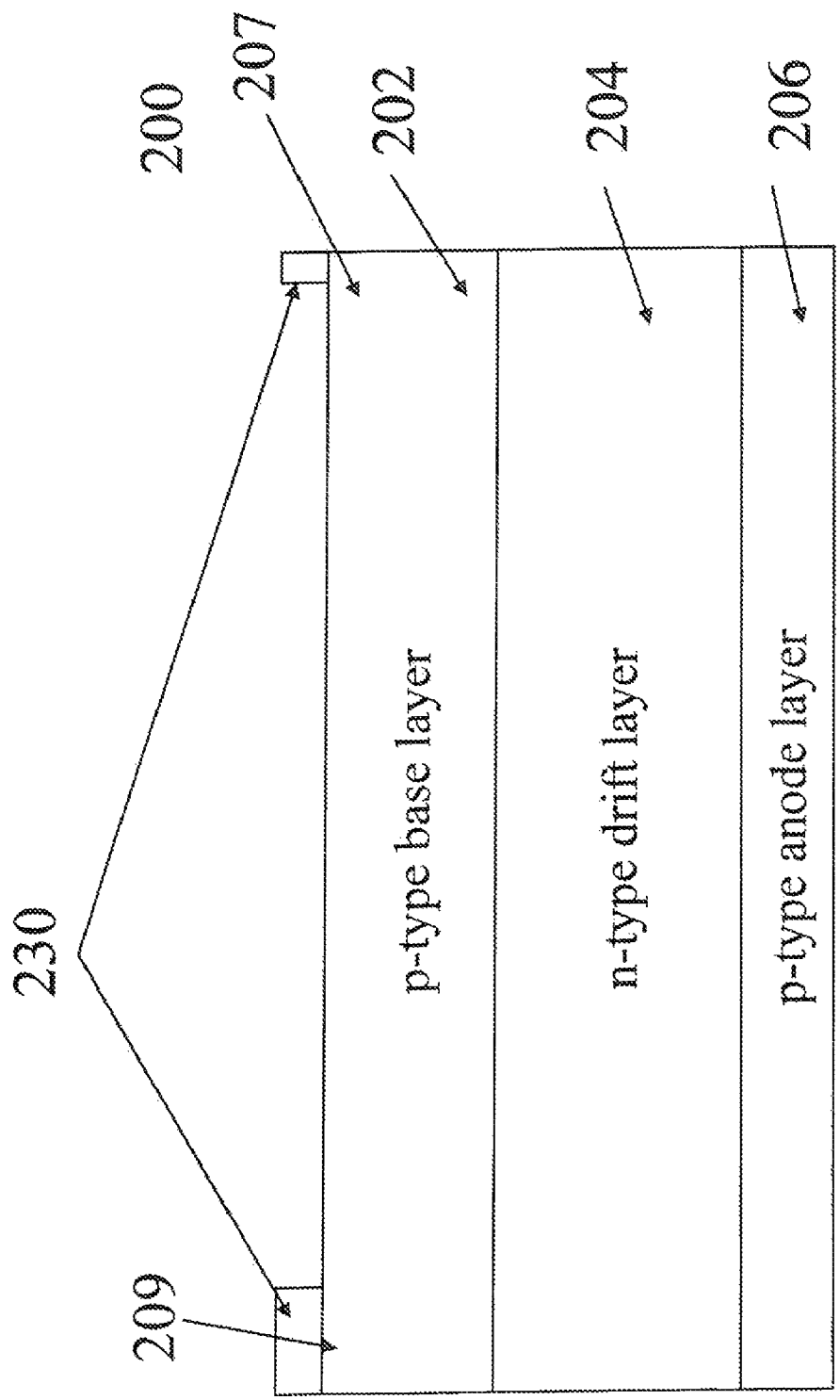
Figure 6:
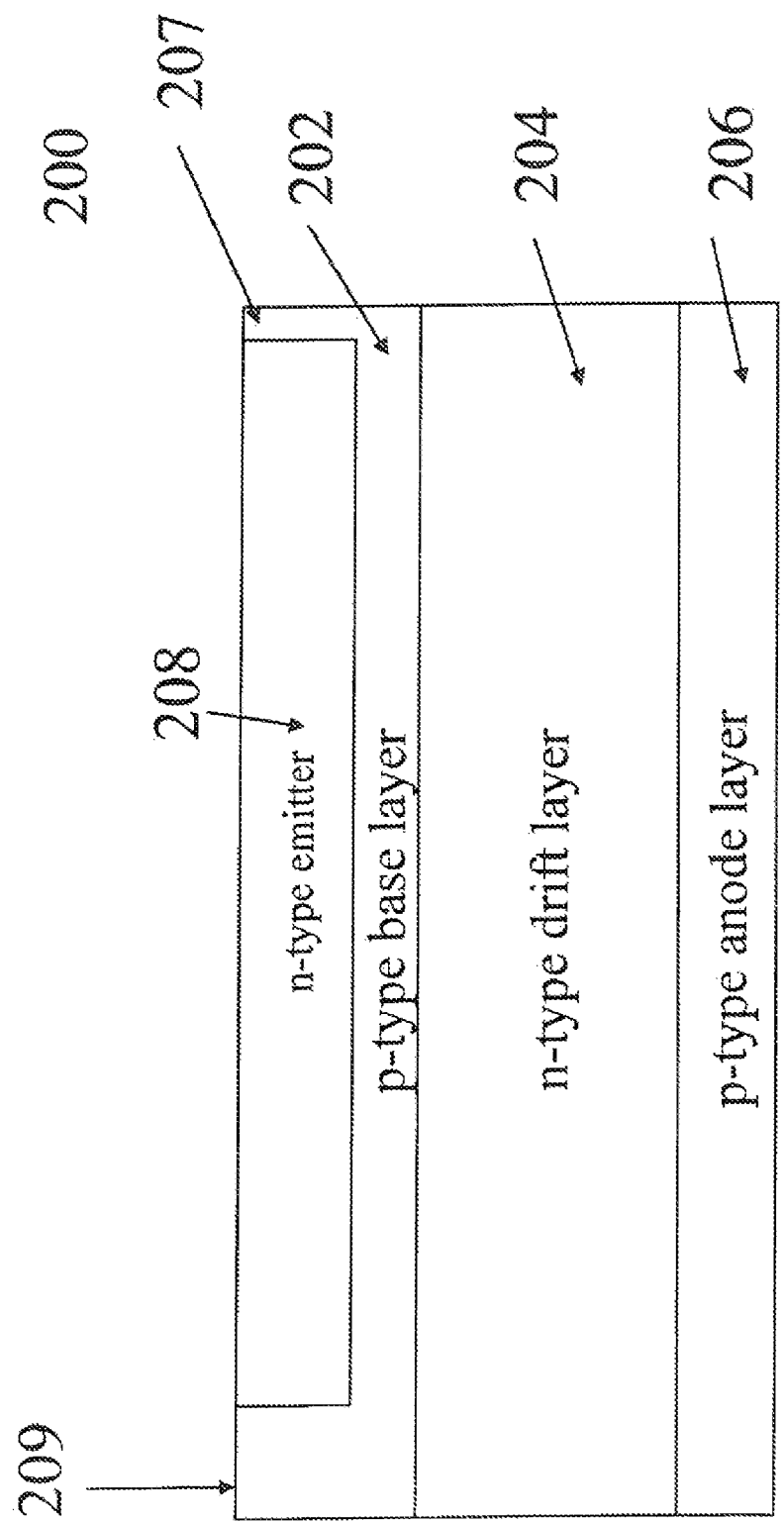

An additional n-type-emitter layer is then introduced onto the top p-type base layer 202, as shown in FIGS. 5 and 6. The profile of the emitter layer is formed by coating the top surface of the p-type base layer 202 with a masking layer of suitable choice for photo-resistance. The masking layer initially covers the whole surface, and portions are removed by the photo-lithographic technique to form a masking pattern 230 as shown in FIG. 5. The covered areas of the masking pattern are for a plurality of cathode shorts and gate contacts. The top emitter layer 208 is then introduced by diffusion or ion implantation on the opening as shown in FIG. 6. The resulting semiconductor body 200 has the basic n-p-n-p structure of a thyristor with a plurality of cathode shorts 207 and gate contacts 209 on the top surface. Various modifications may be made in terms of doping profile and layer thickness to optimize the device electronic properties such as maximum forward and/or reserve blocking voltage, switching characteristics, and other properties.

Figure 7:
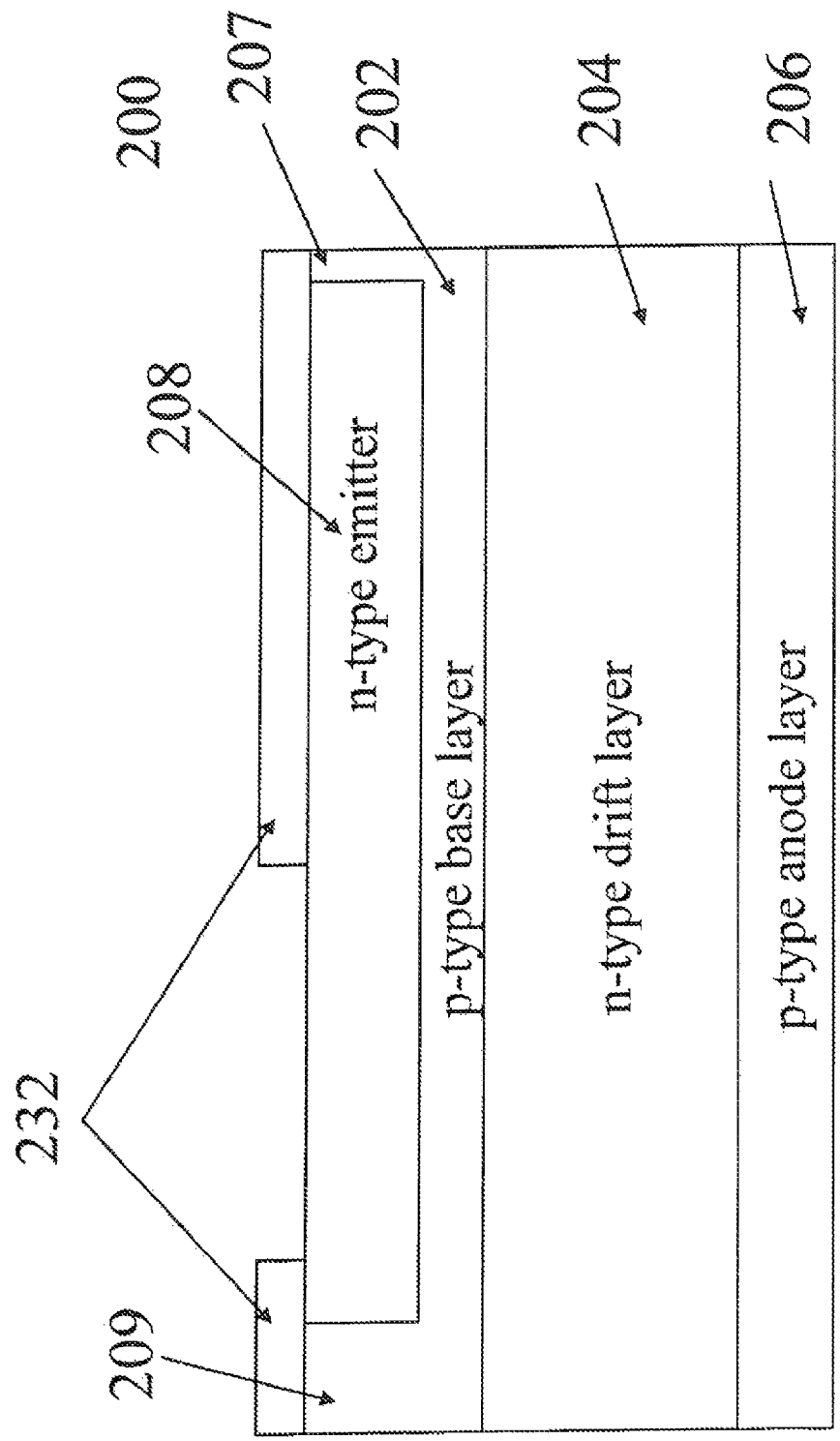
Figure 8:
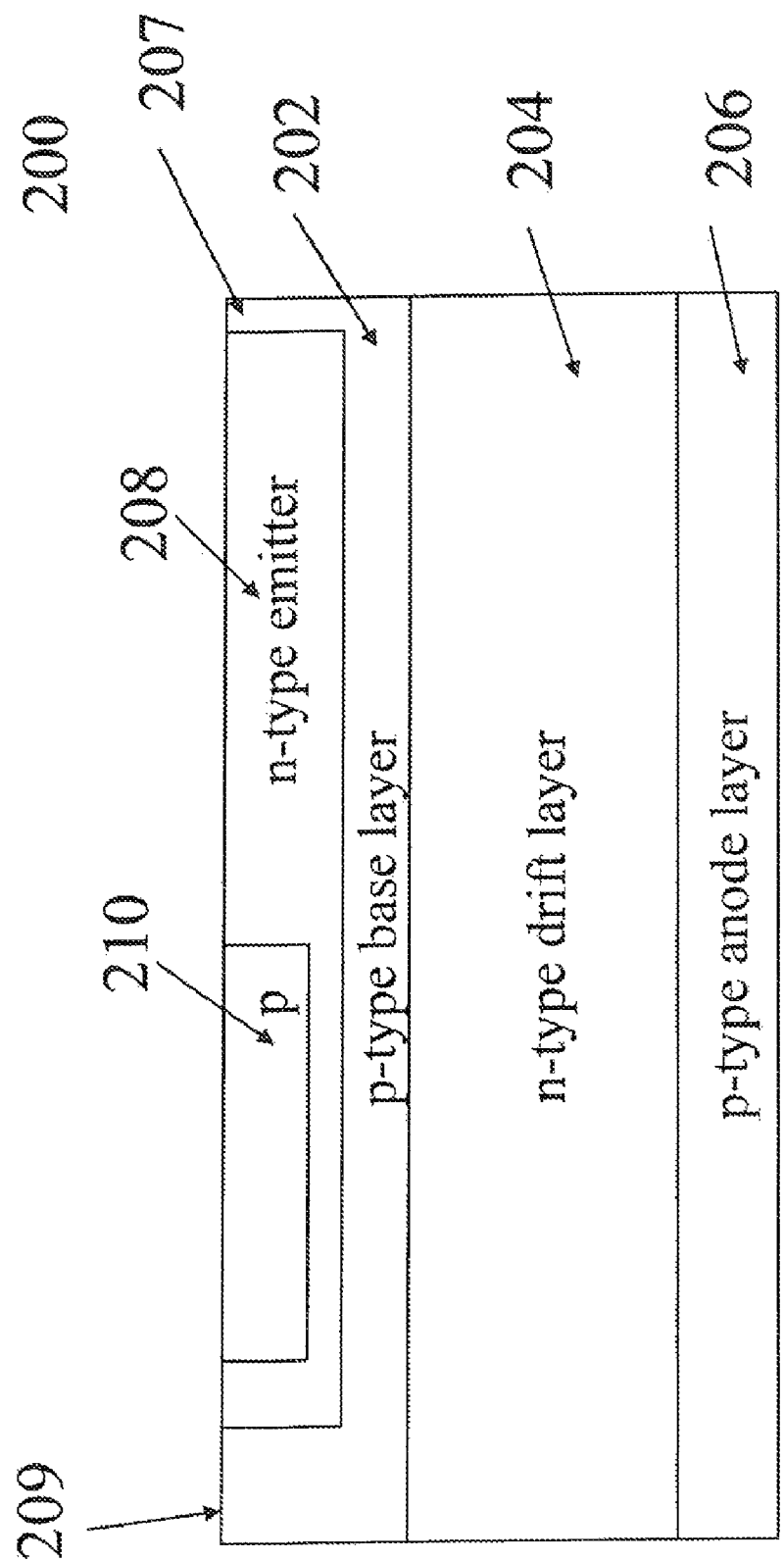
Figure 9:
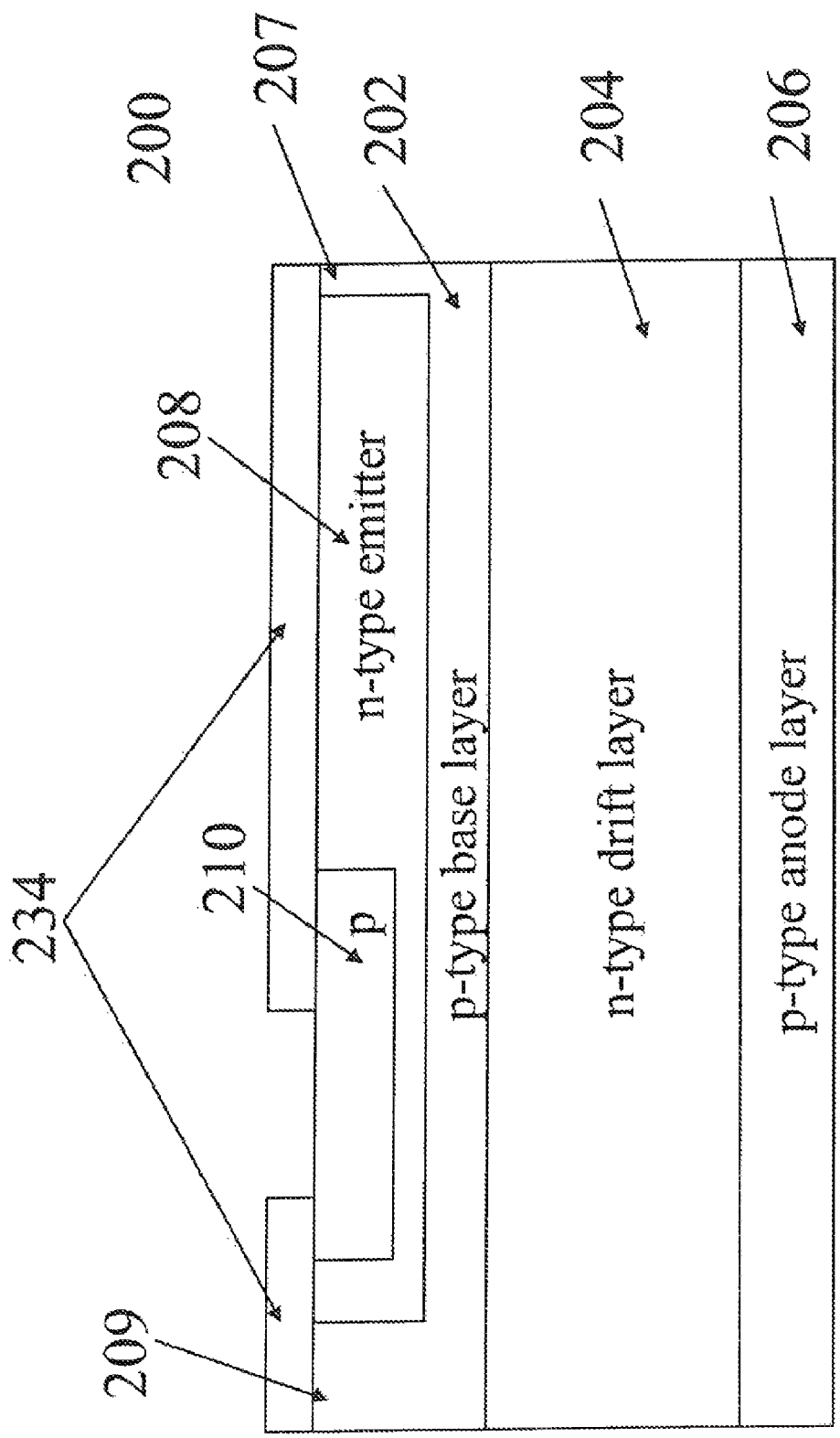
Figure 10:
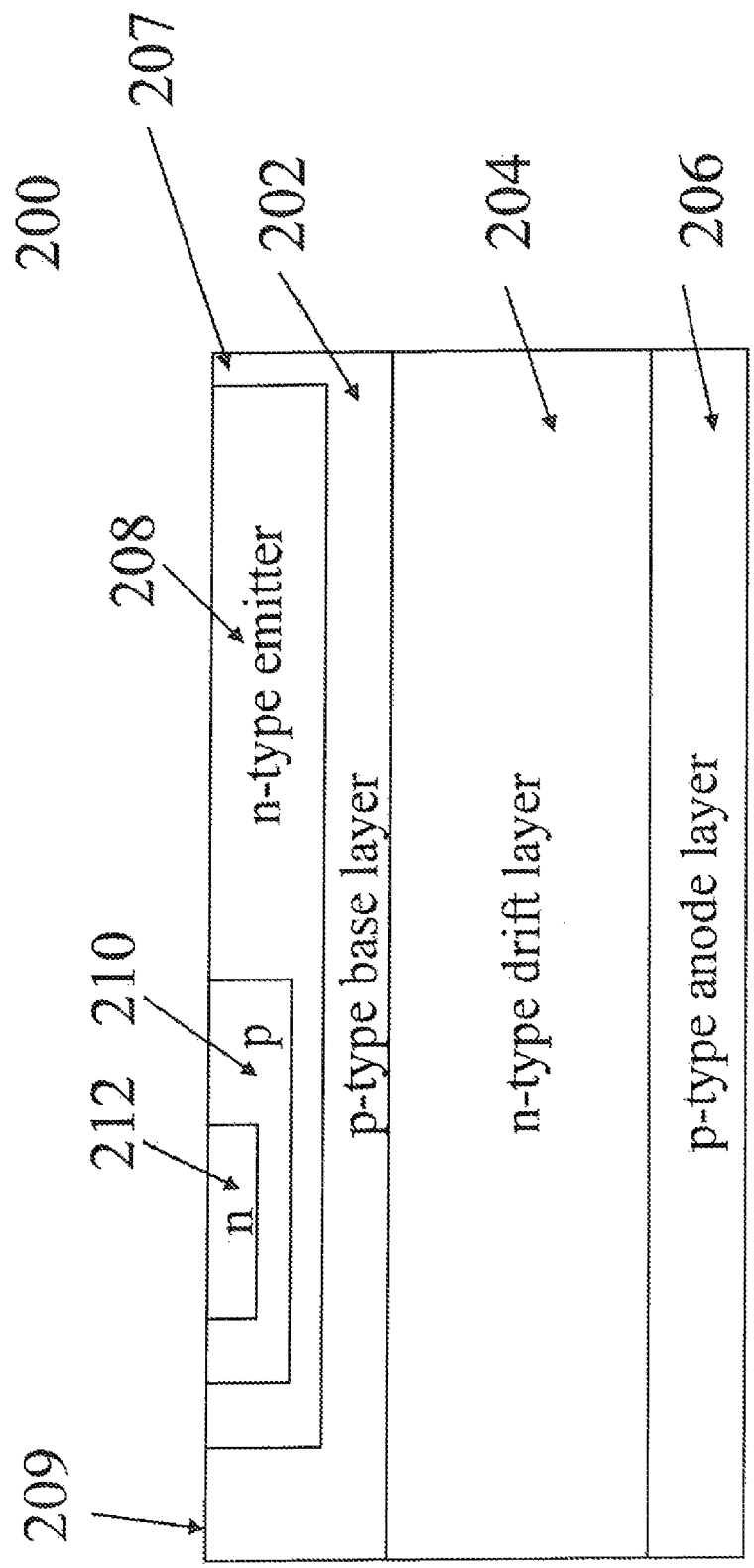

A second masking pattern 232, as shown in FIG. 7, covers portions of the top surface of the emitter layer 208 and has an opening for the introduction of an additional p-type doping zone 210 by diffusion or ion-implantation as shown in FIG. 8. Subsequently, a third masking pattern 234 as shown in FIG. 9 may be introduced on top of the p-type zone to add a n-type doping zone 212 as shown in FIG. 10. The last two oppositely doped zones, 210 and 212, form a PN junction and that may act as a switching diode 211 for the turn-off process.

Figure 11:
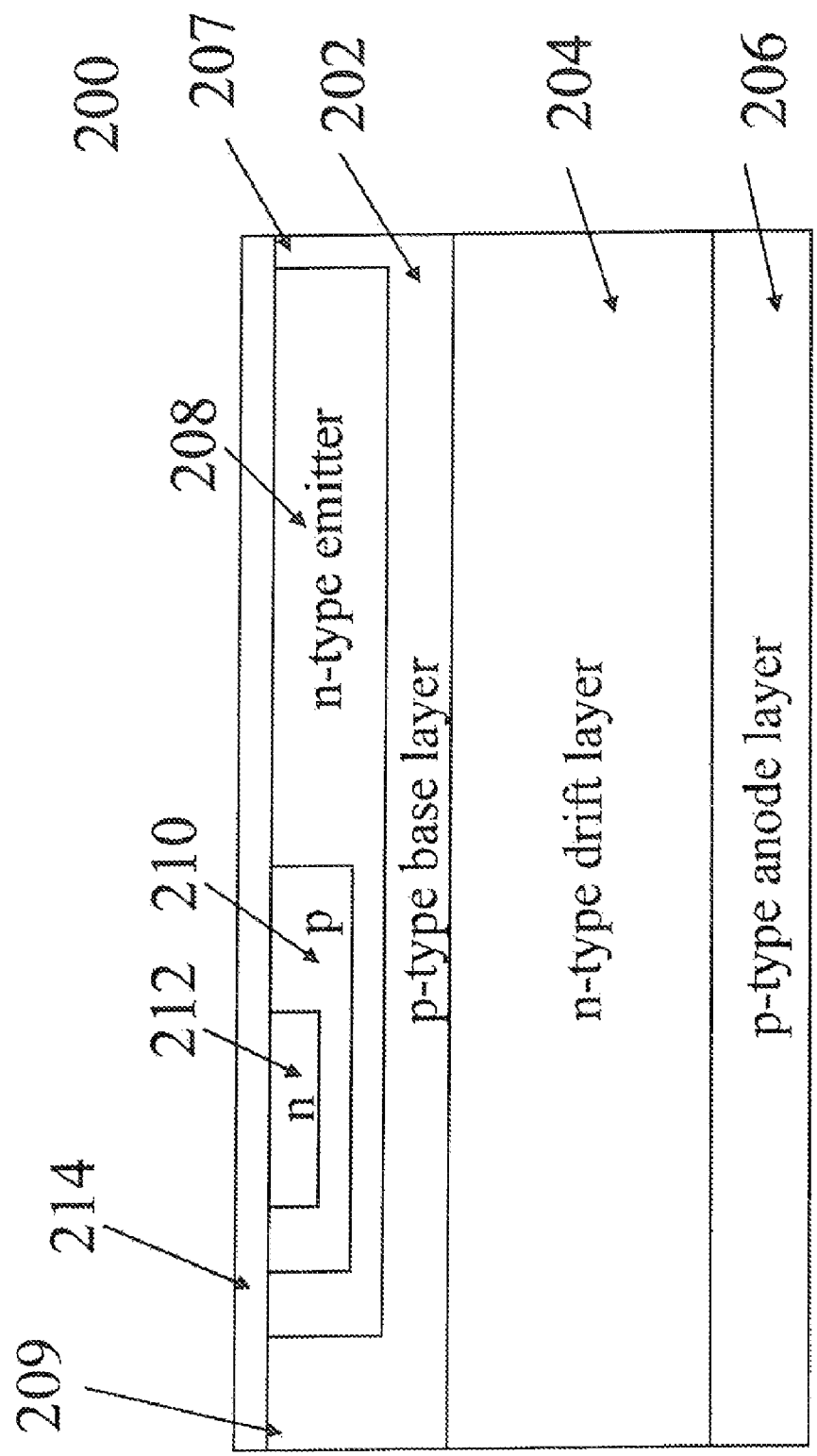
Figure 12:
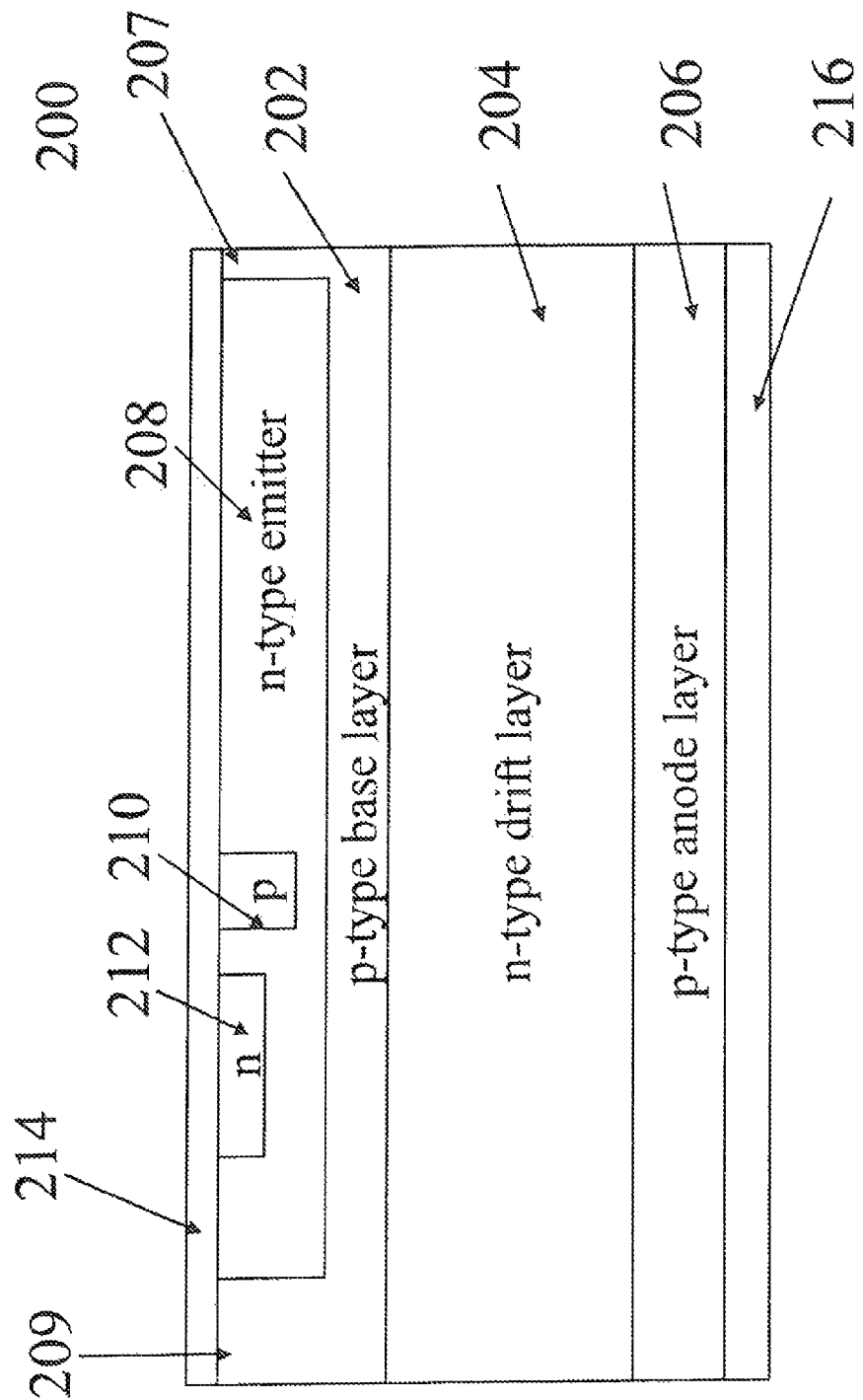
Figure 13:
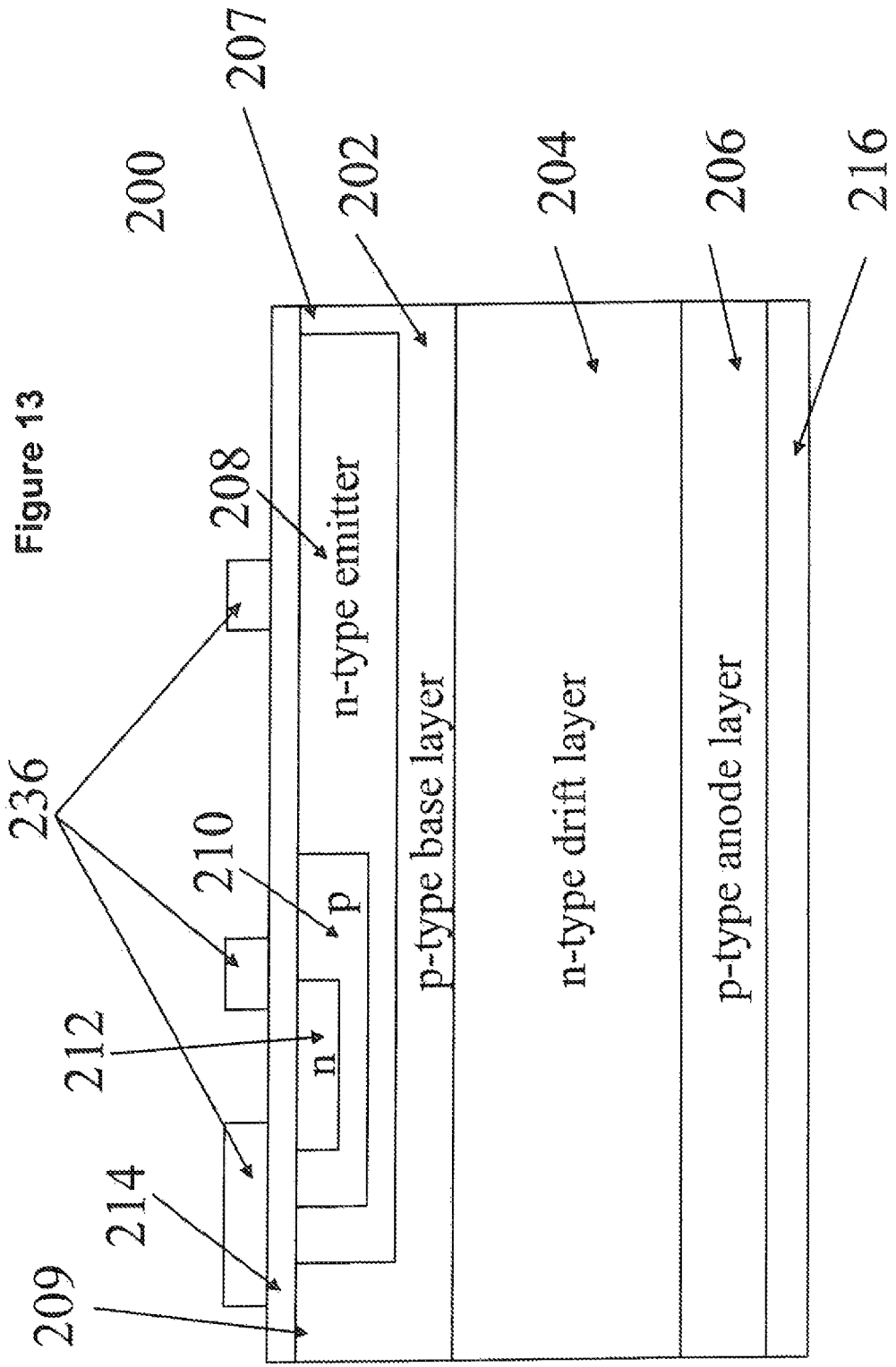
Figure 14:
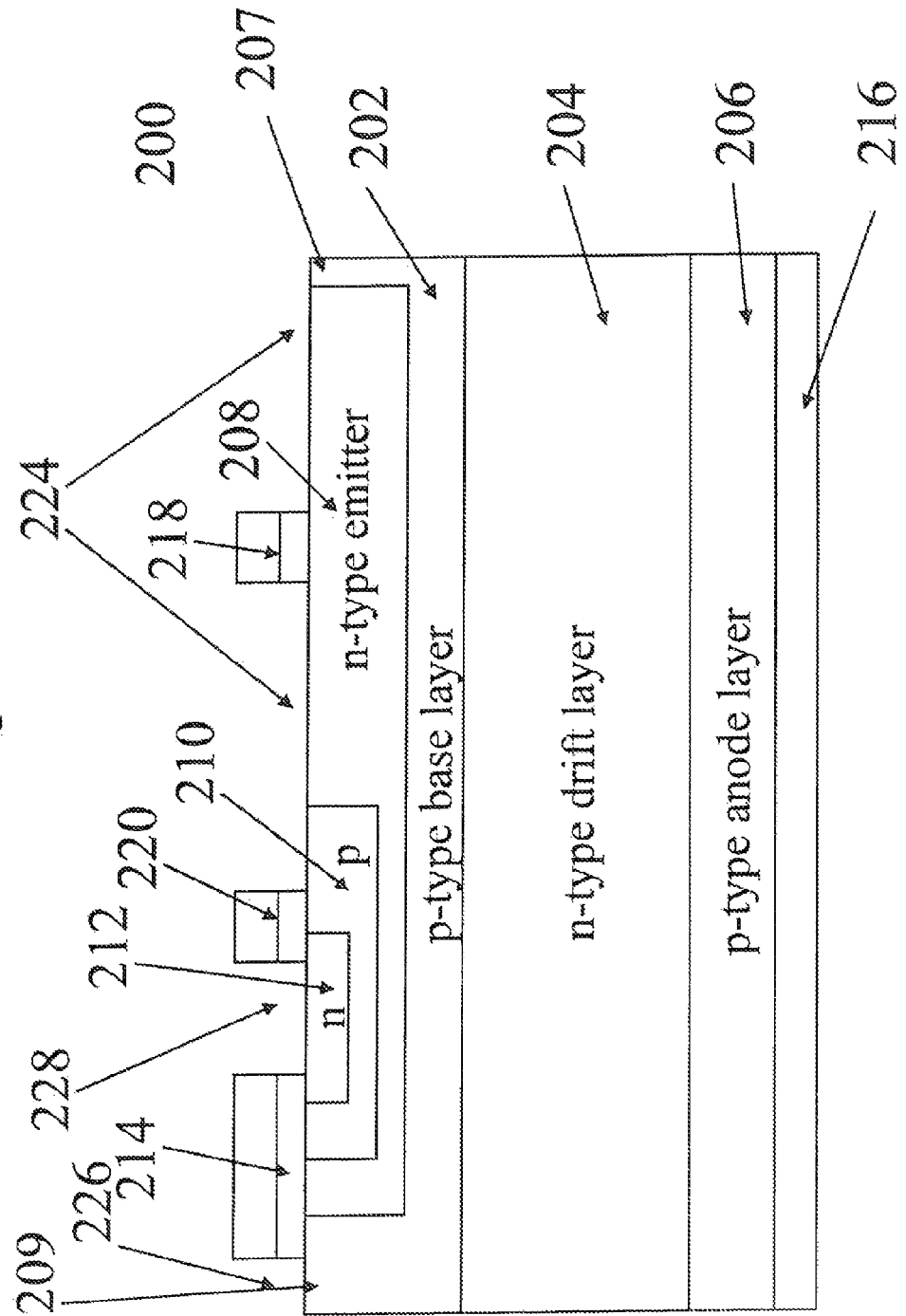
Figure 15:
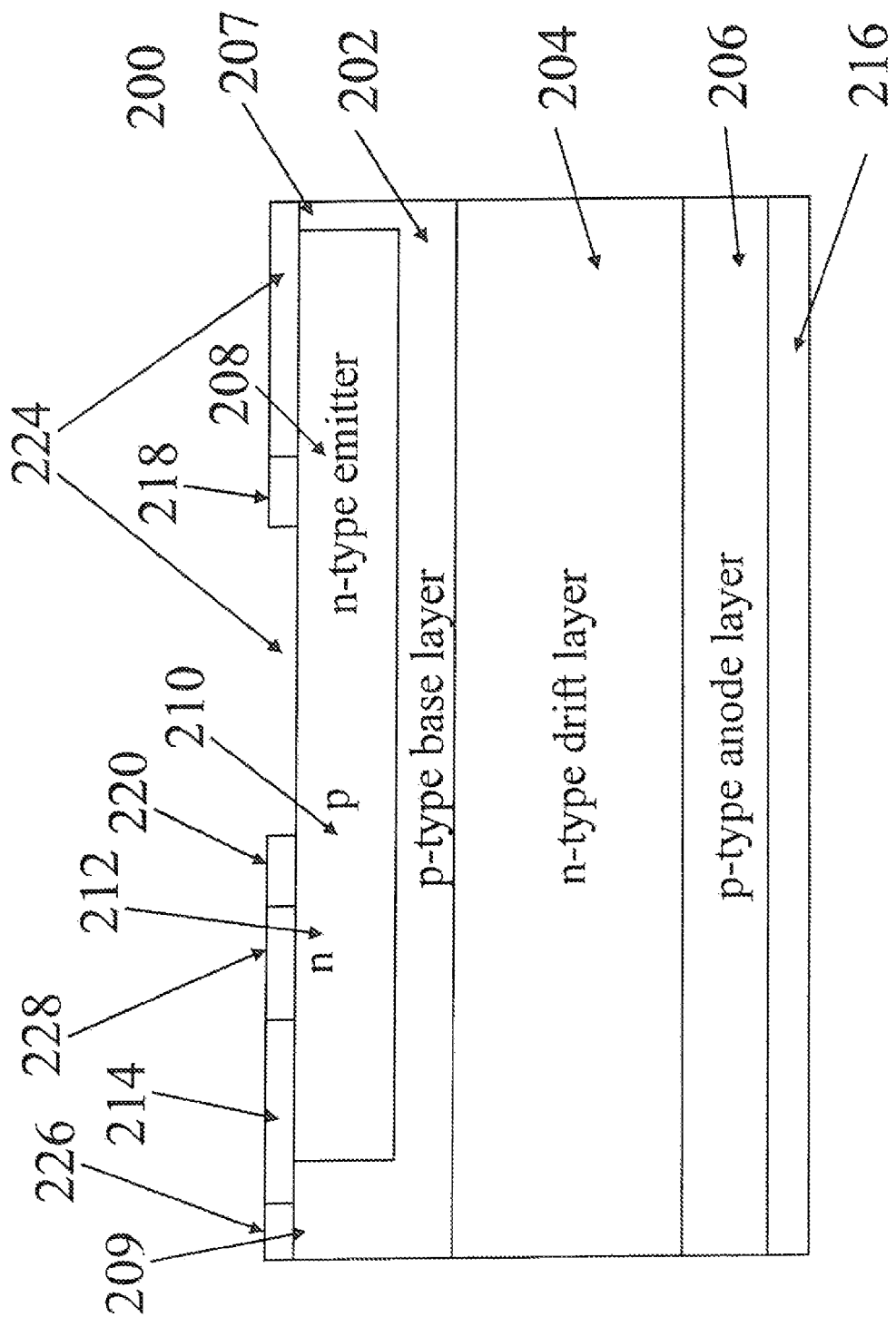

An insulating layer 214 is deposited to cover the top surface of the semiconductor body 200 as shown in FIG. 11. The anode electrode 216 may be added by a contact metallization on the bottom surface as shown in FIG. 12. For the top metallization, the insulating layer 214 on the top surface may be first masked with the pattern 236 as shown in FIG. 13. The opening portions of the insulating layer are removed by etching. The top is then metallized to form the cathode electrode 224, the gate electrode 226 and the cathode (n-type) end contact 228 of the switching diode as shown, for example, in the steps illustrated in FIGS. 14 and 15. The n-type emitter layer 208 and the anode (p-type) zone 210 of the switching diode are electrically shorted by the cathode 224. In addition, a plurality of the cathode-shorts 207 distributed on the cathode electrode 224 of a device suppress the gain of the parasitic top NPN transistor to improve the forward blocking voltage.

The insulating layer is transparent to light and two optical apertures 218 and 220 in each device unit resulted from the masked and un-etched areas on the top surface. The optical aperture 218 is an opening in the cathode electrode over the emitter layer for permitting turn-on light. The optical aperture 220 is over the junction area of the embedded switching diode 211.

Figure 16:
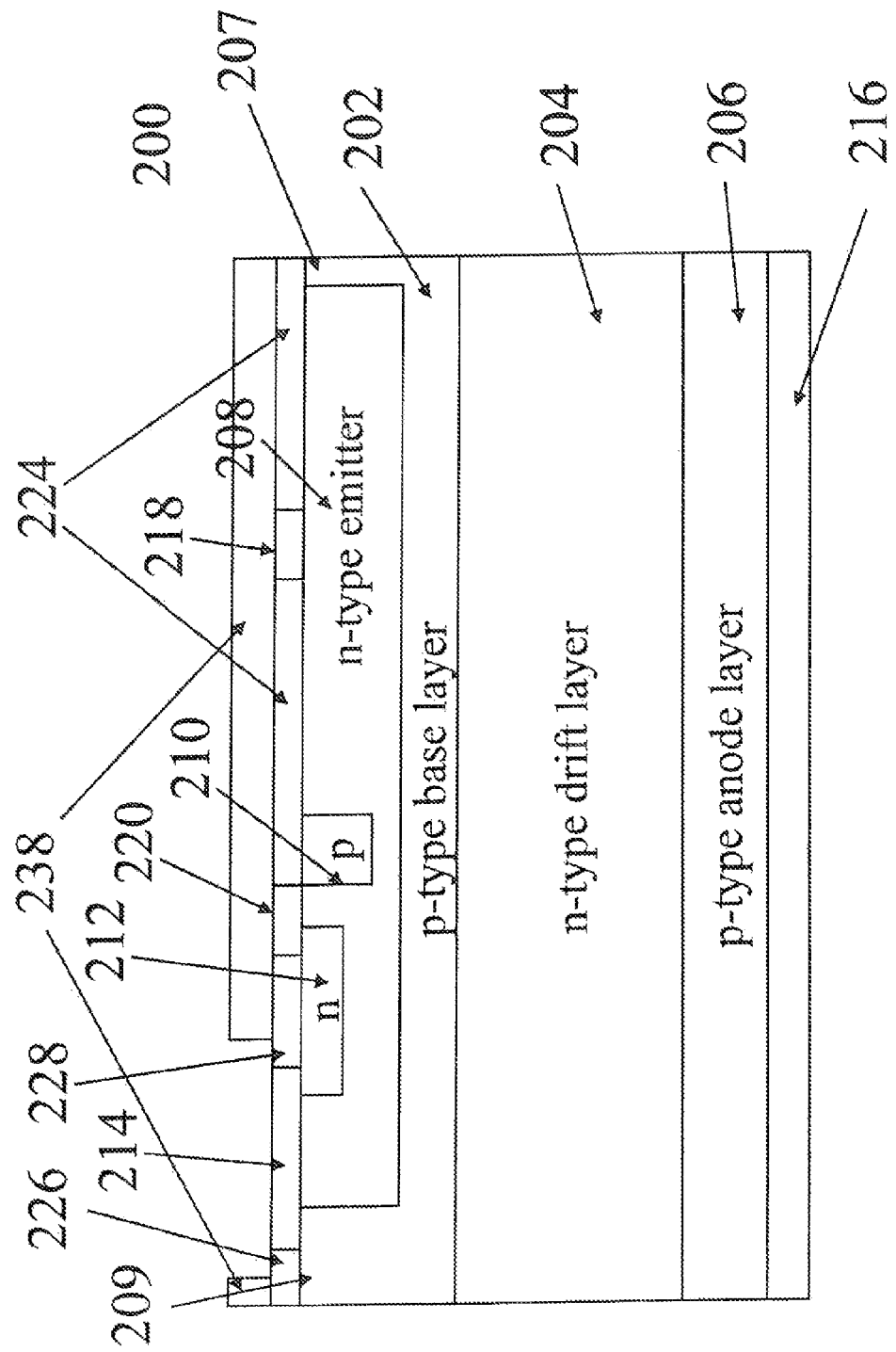
Figure 17:
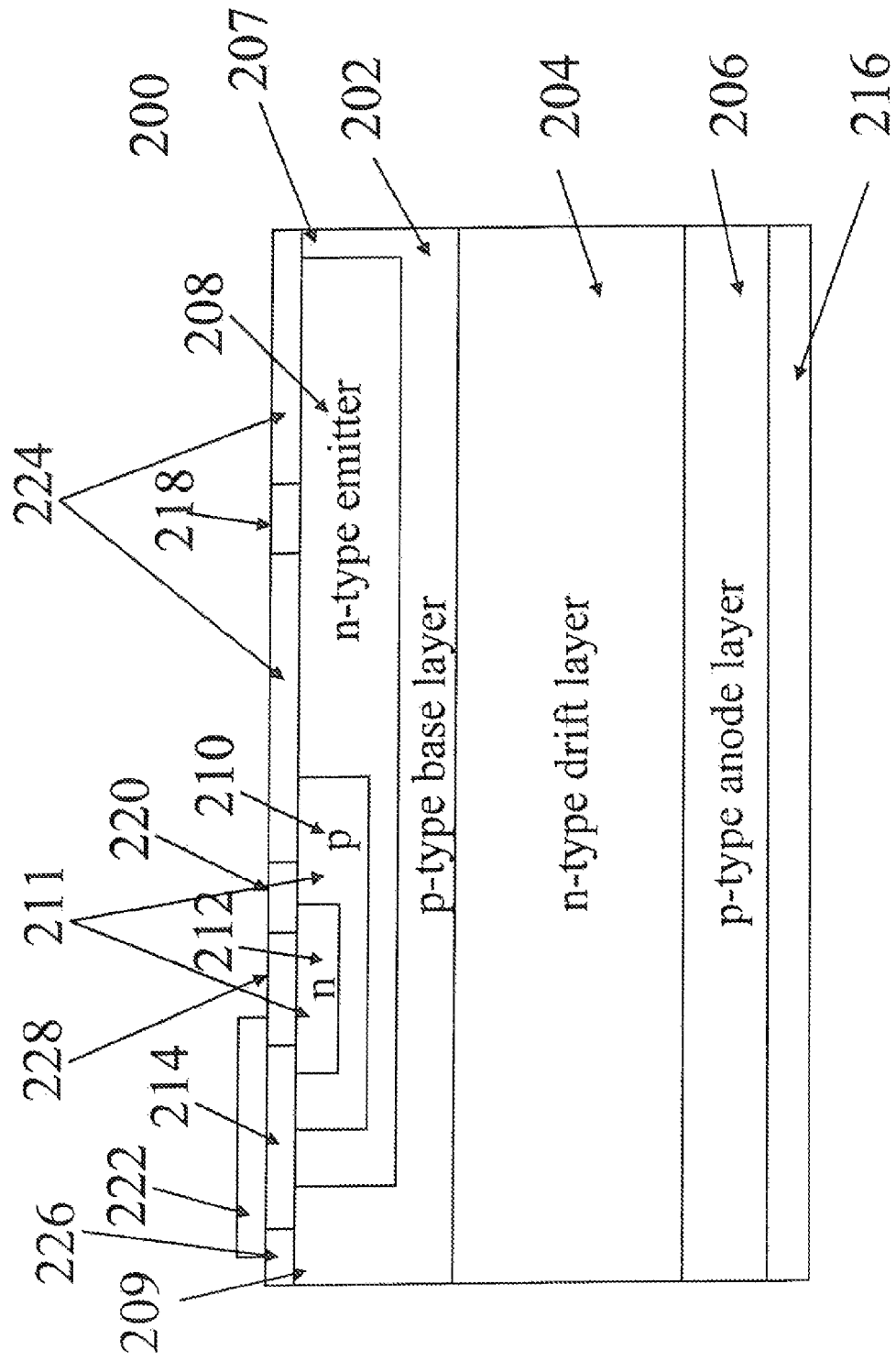

The gate 226 and the diode cathode contact 228 are linked by first masking the top surface with the pattern shown in FIG. 16 and interconnecting with subsequent metallization over the insulating layer as shown in FIG. 17. The floating gate comprised of the interconnect 222, the gate 226 and the diode cathode contact 228 is kept floating during operation and diverts the thyristor current when the embedded switching diode is shorted by light.

Another embodiment is shown in FIG. 2 with a non-planar construction. The layers of the embedded switch-off diode-structure may be deposited epitaxially or in poly-crystallized form, or wafer bonded on top of the emitter layer. The wafer bonding may involve bonding wafers together having the same and/or different materials. The non-planar construction may be fabricated by following a mesa etching processes. The top surface may also be smoothed through the standard planarization process or any other process. The deposited layers may be different semiconductor material from the underlying layers of the basic thyristor structure for selection of optical wavelength.

Having described planar and non-planar embodiments and associated methods of manufacturing, it will be understood by those having ordinary skill in the art that changes may be made to those embodiments without departing from the spirit and scope of the present invention.

In operation, the monolithically integrated light activated thyristor 200 in FIG. 17 may be connected to a circuit through the anode electrode 216 and the cathode electrode 224, while the floating gate electrode 222 is kept floating. For a forward blocking operation, the anode electrode 216 may be forward biased relative to the cathode electrode 224. Under high voltage, a small forward leakage current may pass through the device and multiple cathode-short regions 207 in a device provide a protection against premature turn-on through the leakage current gain. In addition, a voltage holding capability exists and may be enhanced through manipulation of resistivity across the embedded switching diode 211. Illuminating light through the aperture 220 also may create cathode shorts through the change in resistivity of the embedded diode.

In the turn-on process, a light pulse is initially introduced through the turn-on aperture 218, preferably via an optical fiber, to illuminate the main body of the thyristor 200. The optical pulse generates a dense concentration of electrons and holes through absorption across the device. The photo-generated carriers, acting as the base current injection from the gate in the conventional thyristor, collapse the depletion region across the p-type base region 202 and the n-type drift region 204. Shorting the n-type emitter layer 208 and the n-type drift layer 204 results in the forward conduction state.

The thyristor 200 stays on through regenerative action even after the light is turned off. The turn-on process, utilizing light activation, is relatively fast compared to electronic turn-on thyristors. To generate photo-carriers, the photon energy of the light pulse should be above the energy band gap of the semiconductor material in use. The penetration depth of the light in the device may be adjusted by varying the wavelength of the activation light such that the illuminating light reaches through the p-type base layer 202 and into the n-type drift layer 204.

In an embodiment of the monolithically integrated light activated thyristor, the embedded switching diode 211 is comprised of the p-type region 210 and the n-type region 212. The cathode electrode 224 lays over both the n-type emitter 208 and the anode (p-type) junction side 210 of the switching diode 211. The p-type base layer 202 is electrically connected to the cathode (n-type) junction side 212 of the switching diode 211 through the floating gate 222 and is insulted with a dielectric layer from the p-type region 210 of the switching diode 211 and the n-type emitter region 208. While the thyristor is under forward bias, the PN junction of the embedded switching diode 211 is back-biased, with high resistance.

To turn off the thyristor, the embedded switching diode 211 is illuminated with a through the turn-off aperture 220. This results in the p-type base layer 202 being electrically shorted with the cathode electrode 224. The emitter short results in current bypassing the n-type emitter region 208. Subsequently, it terminates the self-injection into the p-type base layer 202 and turns off thyristor 200.

In order to avoid unwanted carrier injection onto the p-type base layer 202 during the turn-off process, the illuminated light should have a shorter absorption depth compared to the turn-on light such that it does not reach the depth of the p-type base layer 202. As mentioned above, an appropriate wavelength may be selected to fit the requirement. In addition, the deposition of different semiconductor materials also may accommodate different absorption wavelengths such that the thyristor structure is transparent to the turn-off light. The resistance of the switching diode 211 may be controlled by the amount of light introduced through the aperture 220. To prevent the high dV/dt turn-on during the forward blocking state, a low level of light may be introduced onto the switching diode 211 to accommodate the rapid change of the anode voltage in a circuit. In addition to the cathode short 207, a low level of illuminating light also lowers the resistance of the switching diode 211 to pass through the induced current flow due to the built-in capacitance of the thyristor 200. The low level light may be turned off during the turn-on process so as to maintain the on-state voltage drop across the n-type emitter 208 and the p-type base 202.

Figure 1:
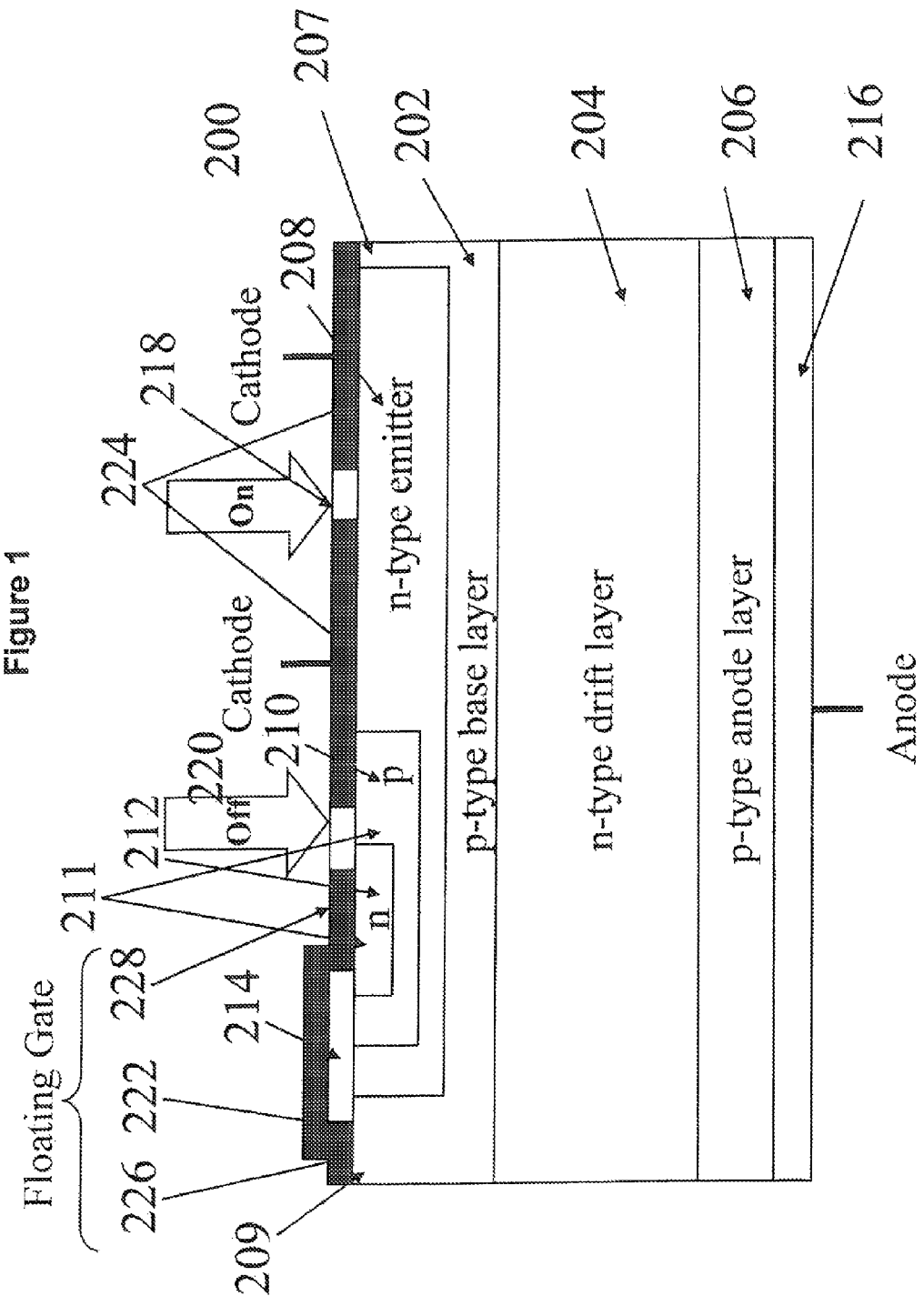
FIG. 1 shows, in cross section, a unit cell of an embodiment comprising a four layer thyristor structure, an embedded turn-off switching diode, and two separated optical apertures for turning on and off control with light beams, according to an embodiment of the present invention.
Figure 3B:
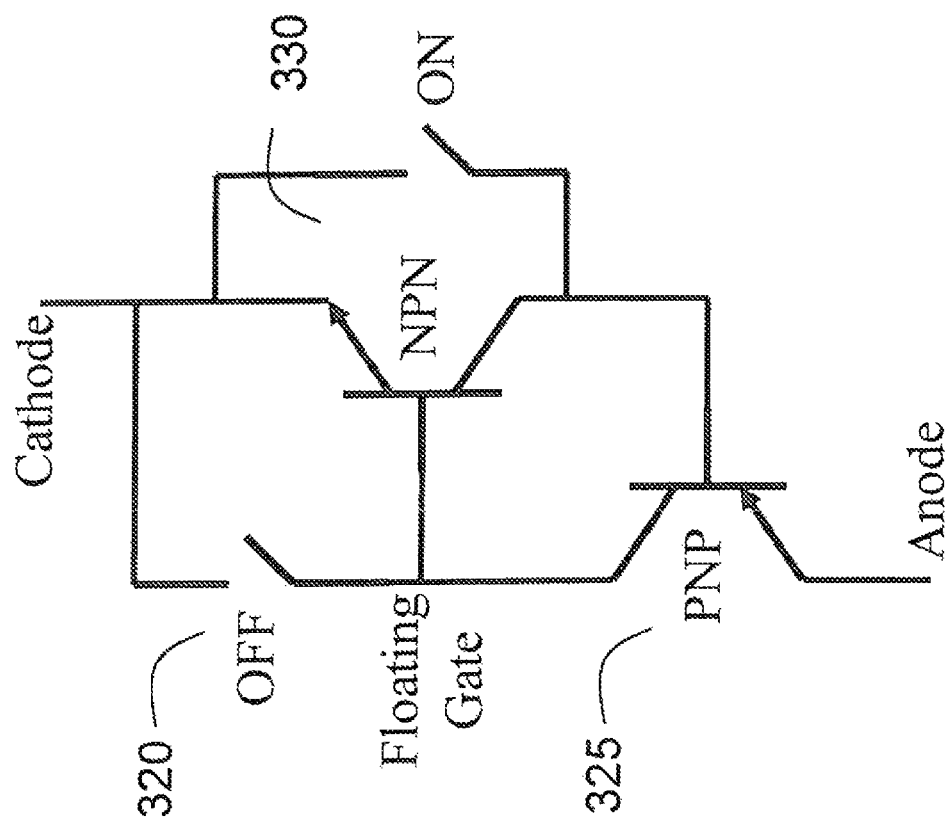

In summary, according to an embodiment of the present invention, during the forward blocking state of the thyristor 200 operated in a circuit, the resistance of the embedded switching diode 211 is modulated by low level light so that a resistive emitter-short is created to increase the dV/dt hold-off capability. The elimination of the low level light through the aperture 200 recovers the high resistive state of the switching diode 211 for the thyristor on state. To turn on the thyristor, a high level of illumination through the aperture 218 generates photo-carriers across the main body of the thyristor 200 and turn-on the device. To turn off the activated thyristor 200, a high level light is introduced onto the embedded switching diode 211 through aperture 220 to create an electrical short between the p-type base layer and the cathode 224 to terminate the self-injection within the thyristor 200 and turn off the thyristor 200. Once the thyristor 200 is turned off, the illumination of a low level light over the embedded switching diode 211 may be resumed to enhance the dV/dt hold-off capability in addition to the cathode short. FIGS. 3A and 3B depict potential schematics of this design according to an embodiment of the present invention. Referring to FIG. 3A, three devices are illustratively shown coupled together, respectively 300, 305 and 310. A N type region of device 300 is illustratively shown as coupled to respective P type regions of devices 305 and 310. This node has been described herein as a floating gate node. A P type region of device 300 is shown as coupled to the cathode and one of the N type regions of device 310. The other N type region of device 310 is shown coupled to the N type region of device 305. The other P type region of device 305 is coupled to the anode. Referring to FIG. 3B, devices 320, 325 and 330 respectively show electrical representations of devices 300, 305 and 310.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

In particular, it be apparent that while particular semiconductor structures have been illustrated and while particular processing steps have been shown, numerous variations are possible and contemplated by the applicants. For example, it will be understood that the circuit shown in FIGS. 3A and 3B may be physically realized in an integrated semiconductor structure in many different ways. The Figures depict one way of implementing an embodiment of the invention in a semiconductor structure. However it will be understood that the semiconductor layering scheme may be changes, and the junction locations and profile, insulator layers and contacts may be changed for any reason. In addition, while silicon has generally be described, it will be understood that any other type of semiconductor structure may be implemented.

What is claimed is:

1. A method of switching an optically controlled thyristor structure having an anode, a cathode, a base layer and a drift layer, comprising:
    illuminating the thyristor base layer and the thyristor drift layer with light through at least one aperture formed through thyristor cathode electrode to generate photo-carriers in a light penetrated region to turn on the thyristor.

* * * * *